(12) United States Patent
Nishioka et al.

(10) Patent No.: US 7,901,474 B2
(45) Date of Patent: Mar. 8, 2011

(54) POLISHING COMPOSITION AND POLISHING METHOD

(75) Inventors: Ayako Nishioka, Chiba (JP); Yuji Itoh, Chiba (JP); Yoshitomo Shimazu, Shiojiri (JP)

(73) Assignee: Showa Denko K.K., Tokyo (JP)

( * ) Notice: Subject to any disclaimer, the term of this patent is extended or adjusted under 35 U.S.C. 154(b) by 804 days.

(21) Appl. No.: 11/793,347

(22) PCT Filed: Dec. 22, 2005

(86) PCT No.: PCT/JP2005/024190
§ 371 (c)(1),
(2), (4) Date: Jun. 19, 2007

(87) PCT Pub. No.: WO2006/068328
PCT Pub. Date: Jun. 29, 2006

(65) Prior Publication Data
US 2008/0138990 A1 Jun. 12, 2008

Related U.S. Application Data

(60) Provisional application No. 60/639,806, filed on Dec. 29, 2004.

(30) Foreign Application Priority Data

Dec. 22, 2004 (JP) ................. 2004-372101

(51) Int. Cl.
*B24D 3/02* (2006.01)
*C09C 1/68* (2006.01)
*C09K 3/14* (2006.01)
*H01L 21/302* (2006.01)

(52) U.S. Cl. ............... 51/307; 51/308; 51/309; 438/692; 438/693

(58) Field of Classification Search ............ 51/307–309; 438/692–693
See application file for complete search history.

(56) References Cited

U.S. PATENT DOCUMENTS

| 5,391,258 | A | 2/1995 | Brancaleoni et al. | |
|---|---|---|---|---|
| 5,770,095 | A | 6/1998 | Sasaki et al. | |
| 5,920,500 | A | 7/1999 | Tehrani et al. | |
| 6,579,153 | B2 | 6/2003 | Uchikura et al. | |
| 6,930,037 | B2 | 8/2005 | Tsuchiya et al. | |
| 2001/0049913 | A1* | 12/2001 | Miyata | 51/308 |
| 2003/0051413 | A1* | 3/2003 | Sakai et al. | 51/307 |
| 2008/0087644 | A1 | 4/2008 | Nishioka et al. | |

FOREIGN PATENT DOCUMENTS

| JP | 08-083780 A | 3/1996 |
|---|---|---|
| JP | 10-116490 A | 5/1998 |
| JP | 2819196 B2 | 10/1998 |
| JP | 2001-115146 A | 4/2001 |
| JP | 2001-196336 A | 7/2001 |
| JP | 3450247 B2 | 7/2003 |
| JP | 2000-109818 A | 4/2004 |
| JP | 2004-263074 A | 9/2004 |
| WO | WO 2004/076574 A2 | 9/2004 |

* cited by examiner

*Primary Examiner* — Anthony J Green
*Assistant Examiner* — Pegah Parvini
(74) *Attorney, Agent, or Firm* — Sughrue Mion, PLLC

(57) ABSTRACT

The present invention provide a chemical-mechanical polishing composition for inhibiting dishing and erosion as well as rapidly polishing an insulating film and barrier film at the same time while maintaining the flatness of the substrate surface polished. The present chemical-mechanical polishing composition comprises methanesulfonic acid, an alkali metal ion, an oxidizing agent, a silica abrasive and water, and has a pH of 8 to 12.

19 Claims, 2 Drawing Sheets

(a)

(b)

(c)

POLISHING COMPOSITION AND POLISHING METHOD

CROSS REFERENCE TO RELATED APPLICATION

This application is an application filed under 35 U.S.C. §111 (a) claiming benefit pursuant to 35 U.S.C. §119 (e) of the filing date of Provisional Application No. 60/639,806 filed on Dec. 29, 2004, pursuant to 35 U.S.C. §111 (b).

TECHNICAL FIELD

The present invention relates to a polishing composition for polishing a substrate and, particularly, to a polishing composition for polishing metal, to a polishing method, and to a method for producing a substrate.

RELATED ART

Technical developments in the field of ICs (integrated circuits) and LSI (large scale integration circuits) have provided improvements in operating speeds and degrees of integration. For example, recently, the performance of microprocessors and the capacity of memory chips have been improved rapidly. Such improvements have, in large measure, been attained by virtue of development of micro-processing techniques. One typical example of the micro-processing techniques is a chemical-mechanical polishing process, which is a planarization technique. A chemical-mechanical polishing process is employed in planarization of an inter-layer dielectric film, a metal plug, metal wiring, etc. during multi-layer wiring steps.

Among wiring metals, in recent years, copper or copper alloy has been employed so as to prevent a problem of wiring delay. Such copper or copper alloy wiring is produced by forming trenches in an inter-layer dielectric film in advance, forming a thin barrier film to prevent diffusion of copper into the inter-layer dielectric film, and depositing copper or copper alloy through a technique such as the damascene process. According to the above process, excess copper or copper alloy remains on the inter-layer dielectric film. Thus, the wiring is produced by removing the excess copper or copper alloy through polishing for planarization.

Meanwhile, a magnetic random access memory (MRAM) is one example of magnetic recording media of interest. Regarding MRAM, a method for recording information to a specific bit of the element array has been known. In the method, a bit-writing-in line and a word-writing-in line, which cross with each other and respectively extending in the lengthwise and widthwise directions, are provided, and information is written exclusively in a specific bit located in the region where the two lines cross each other (see, for example, Japanese Unexamined Patent Publication (Kokai) No. 10-116490). The metal wiring used in the MRAM includes a conductor layer composed of aluminum or aluminum alloy, or copper or copper alloy; a ferromagnetic layer composed of nickel-iron (e.g. Permalloy), etc. and surrounding the conductor layer; and thin barrier films composed of tantalum, tantalum nitride, etc. and sandwiching the ferromagnetic layer. The metal wiring is formed through the damascene process, and excess portions of the conductor layer, the ferromagnetic layer and the barrier film are removed through polishing to provide a plane surface.

The barrier film is formed as a layer underlying the copper, the copper alloy or the like of the wiring so as to prevent diffusion of copper into the inter-layer dielectric film. As for the barrier layer, for example, a tantalum compound such as tantalum, tantalum alloy and tantalum nitride is used. The barrier layer on the inter-layer dielectric film other than the wiring portion must be removed by polishing. The polishing of the barrier film is important because it affects the final properties of the copper wiring, and must be performed without causing loss of copper wiring, generation of polishing scratches, or the like.

In order to enhance the production efficiency of a semiconductor device, a high polishing removal rate for copper and the barrier film is demanded. However, the metal used for the barrier film has a hardness higher than that of copper, and therefore cannot be polished and removed at the same speed as copper.

When there is a difference in the removal rate between copper and the barrier film, this brings about a dishing phenomenon wherein an excavated portion is formed in the copper buried in a trench surrounded by a barrier metal, as a result, an increase in wiring resistance or a short circuit of the wiring occurs and the reliability decreases.

Furthermore, the width of wiring tends to be narrower. In the case where fine wiring lines are located at a high density, there arises a phenomenon called erosion wherein a barrier film and an inter-layer dielectric film are over-polished to form an excavated portion. Similarly to dishing, the erosion gives rise to an increase in wiring resistance or a short circuit of the wiring. Therefore, the prevention of erosion is demanded.

As for the metal polishing composition capable of polishing a metal film comprising copper or a copper alloy, while preventing a phenomenon such as dishing or erosion, for example, Japanese Unexamined Patent Publication (Kokai) No. 8-83780 discloses a composition comprising hydrogen peroxide, benzotriazole and aminoacetic acid and if desired, further comprising abrasive grains. It is stated that the benzotriazole reacts with an oxidized metal film to form a protective film, and thereby allows for preferential mechanical polishing of the protruded portion to enhance the flatness and contributes to little dishing.

The barrier film has a high hardness as compared with copper or a copper alloy, and greatly differs in chemical properties from copper. Accordingly, by using such a combination of the polishing materials used for copper or a copper alloy, a sufficiently high removal rate of the barrier layer is not obtained, in many cases.

In order to solve this problem, a two-step polishing method comprising a first step of polishing copper or a copper alloy at a high speed and a second step of polishing a barrier layer is being studied.

In the second step of polishing a barrier film, for the purpose of eliminating the level difference generated in the first step or removing the cap layer of low-k film, polishing of an inter-layer dielectric film is sometimes required as well as polishing of the barrier film.

Furthermore, in a process for an upper layer of a multi level interconnection, copper or a copper alloy may partially remain at the parts other than wiring parts after the first step because of uniformity and flatness fluctuate due to fine level difference or accumulation of non-uniformity in a process for lower layers. Therefore, in the second step, the remaining copper or copper alloy as well as the barrier layer must be polished.

In order to make the surface to be polished flat when an inter-layer dielectric film is entirely exposed, a technique of polishing a barrier layer, a metal in the wiring portion and an inter-layer dielectric film while keeping the surface flatness by setting the removal rate for a barrier layer or a metal in the wiring portion and the removal rate for an inter-layer dielectric film to be almost equal, has been proposed (Japanese Unexamined Patent Publication (Kokai) No. 2001-196336).

Japanese Patent Publication No. 2819196 discloses a technique of suppressing the removal rate for silicon dioxide by using a polishing composition comprising a compound having two acidic groups.

Japanese Patent Publication No. 3450247 discloses a method of polishing a barrier film by using a silica abrasive and a carboxylic acid having a specific structural formula, and this accordingly does not refer to the polishing activity for an inter-layer dielectric film.

Japanese Unexamined Patent Publication No. 2000-109818 discloses a polishing composition comprising an alkylsulfonic acid having 1 to 4 carbon atoms or salt thereof, an abrasive and water. The document describes that a polishing composition comprising an alkylsulfone acid or salt thereof improves the removal rate. Further it is described that the polishing composition preferably has a pH of 2 to 12, and particularly an acidic pH of 2 to 8 in the case of a metal polishing, and a basic pH of 7 to 12 in the case of a silicon wafer polishing. In the example of the document, a polishing of only Ni—P-plated aluminum substrate was shown.

Japanese Unexamined Patent Publication No. 2004-263074 discloses a polishing composition comprising a silica abrasive, methanesulfonic acid, hydrogen peroxide and water as a polishing composition for polishing a surface of a magnetic disk substrate such as Ni—P-plated aluminum substrate. The document describes that the polishing composition preferably has a pH of less than 7, and more preferably a pH of 1 to 4.

Japanese Unexamined Patent Publication No. 2001-115146 discloses a barrier-film-polishing composition, for polishing a barrier film and a metal film at the same time, which comprises a silica abrasive and water and has a pH of 8.5 to 10.5. The document describes that an alumina abrasive has a tendency to aggregate when used in the above pH range and therefore, it is important to use a silica abrasive rather than an alumina abrasive for preventing generation of scratch, etc.

An object of the present invention is to provide a polishing composition which allows high-speed polishing while preventing dishing and erosion and, particularly to maintain the flatness of metal film. Another object of the invention is to provide a method for polishing metal film by use of the polishing composition. Still another object is to provide a method for producing a substrate comprising a step of planarizing the substrate by use of the polishing composition.

DISCLOSURE OF THE INVENTION

As a result of intensive investigations to solve those problems, the present inventors have found that the above-described objects can be achieved by a chemical-mechanical polishing composition comprising methanesulfonic acid, an alkali metal ion, an oxidizing agent, a silica abrasive and water, and having a pH of 8 to 12. The present invention has been accomplished based on this finding. That is, the present invention is as follows.

(1) A chemical-mechanical polishing composition comprising methanesulfonic acid, an alkali metal ion, an oxidizing agent, a silica abrasive and water, and having a pH of 8 to 12.

(2) The chemical-mechanical polishing composition as described in (1) above, wherein the alkali metal ion is potassium ion.

(3) The chemical-mechanical polishing composition as described in (1) or (2) above, wherein the oxidizing agent is hydrogen peroxide.

(4) The chemical-mechanical polishing composition as described in any one of (1) to (3) above, wherein the pH is from 8 to 10.5.

(5) The chemical-mechanical polishing composition as described in any one of (1) to (4) above, wherein the chemical-mechanical polishing composition comprises an additional acid selected from the group consisting of sulfuric acid, lactic acid, an aliphatic dicarboxylic acid having 7 or more carbon atoms, and mixtures thereof.

(6) The chemical-mechanical polishing composition as described in (5), wherein the aliphatic dicarboxylic acid is selected from the group consisting of 3-methyladipic acid, pimelic acid, sebacic acid and tridecanedioic acid.

(7) The chemical-mechanical polishing composition as described in (5) or (6) above, wherein the content of the additional acid is from 0.001 to 10 mass % based on the chemical-mechanical polishing composition.

(8) The chemical-mechanical polishing composition as described in any one of (1) to (7) above, wherein the content of the methanesulfonic acid is from 0.005 to 10 mass % based on the chemical-mechanical polishing composition.

(9) The chemical-mechanical polishing composition as described in any one of (1) to (8) above, wherein the content of the oxidizing agent is from 0.01 to 30 mass % based on the chemical-mechanical polishing composition.

(10) The chemical-mechanical polishing composition as described in any one of (1) to (9) above, wherein the content of the silica abrasive is 30 mass % or less based on the chemical-mechanical polishing composition.

(11) A method for producing a substrate, wherein the method comprises planarizing a substrate by using the chemical-mechanical polishing composition described in any one of (1) to (10) above, the substrate comprising an insulating film having a trench, a barrier film formed on the insulating film, and a wiring material film buried in the trench and covering the barrier film.

(12) The method for producing a substrate as described in (11) above, wherein the wiring material film is a film of copper or a copper alloy.

(13) The method for producing a substrate as described in (11) or (12) above, wherein the insulating film is a film of a material selected from the group consisting of an inorganic silicon compound and an organic compound.

(14) The method for producing a substrate as described in (13) above, wherein the inorganic silicon compound is a material selected from the group consisting of $SiO_2$, SiN, SINO, SIOC, SICN and mixtures thereof.

(15) The method for producing a substrate as described in any one of (11) to (14) above, wherein the barrier film is a film of a material selected from the group consisting of tantalum, a tantalum alloy, a tantalum compound and mixtures thereof.

(16) A composition which provides the chemical-mechanical polishing composition described in any one of (7) to (10) above when the composition is diluted with water.

(17) A method for transporting or storing a chemical-mechanical polishing composition, wherein the method comprises using the composition described in (16) above.

(18) A kit comprising a plurality of compositions, wherein the plurality of compositions provides the chemical-mechanical polishing composition described in any one of (1) to (10) above when plurality of compositions are mixed together or when plurality of compositions are mixed together and diluted with water.

(19) A method for transporting or storing a chemical-mechanical polishing composition, wherein the method comprises using the kit described in (18) above.

According to the chemical-mechanical polishing composition of the present invention comprising methanesulfonic acid, an alkali metal ion, an oxidizing agent, a silica abrasive and water and having a pH of 8 to 12, a barrier film and an insulating film can be simultaneously polished at a high speed while suppressing dishing and erosion and maintaining the flatness.

Also, when an additional acid selected from the group consisting of sulfuric acid, lactic acid, an aliphatic dicarboxylic acid having 7 or more carbon atoms, and mixtures thereof is incorporated into the chemical-mechanical polishing composition of the present invention, the removal rate for a metal such as Cu can be increased while maintaining relatively good property of the present invention of ensuring high-speed planar polishing, and the ratio of removal rates for an insulating film, a barrier film and a wiring metal can be controlled.

Furthermore, according to the polishing method and the production method of a substrate, each using the polishing composition of the present invention, production of a substrate with excellent flatness can be facilitated.

BEST MODE FOR CARRYING OUT THE INVENTION

Figure 1:
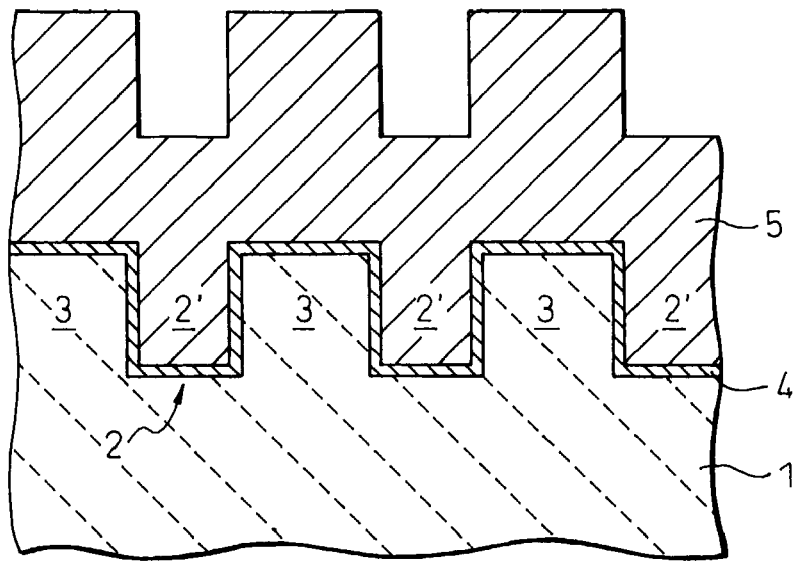
FIG. 1 is a transverse cross-sectional view showing a pattern wafer (a) and a substrate sample (b).
Figure 1:
Figure 1:
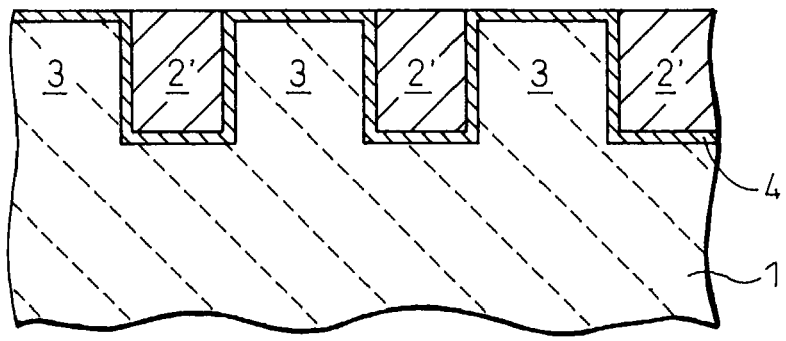
Figure 1:
Figure 1:
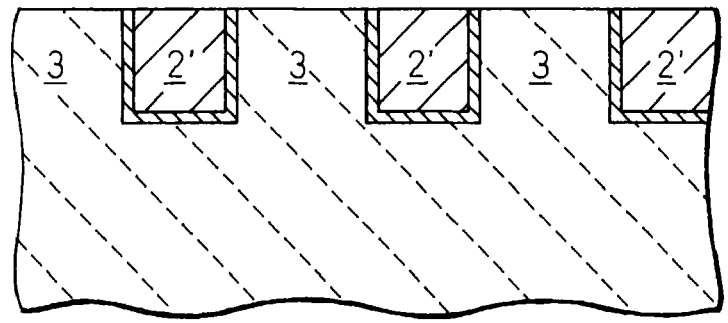

The embodiment of the present invention is described in detail below.

The present invention relates to a polishing composition which can be preferably used for planarizing a metal film covering in a substrate having a trench to be buried in the trench.

The chemical-mechanical polishing composition of the present invention comprises methanesulfonic acid, an alkali metal ion, an oxidizing agent, a silica abrasive and water and has a pH of 8 to 12. The chemical-mechanical polishing composition of the present invention can optionally comprise an acid.

<Methanesulfonic Acid>

Methanesulfonic acid is contained in the polishing composition of the present invention so as to accelerate the polishing and stably perform the polishing.

The content of the methanesulfonic acid is, for example, from 0.005 to 10 mass %, preferably from 0.01 to 5 mass %. If this content is too small, a sufficiently high removal rate for a metal film and an insulating film may not be obtained, whereas if it is excessively large, the removal rate for copper or a copper alloy is increased and dishing phenomenon proceeds to fail in planarization, or depending on the case, stability of the solution can be hardly obtained.

<Alkali Metal Ion>

The alkali metal ion contained in the polishing composition of the present invention is any alkali metal ion, preferably potassium. The alkali metal ion may be supplied from any compound, and may be supplied, for example, from sodium hydroxide, potassium hydroxide, potassium carbonate or potassium hydrogencarbonate, preferably from potassium hydroxide. A hydroxide is preferably used because the pH of the polishing composition of the present invention can be easily adjusted to an alkaline region.

<Oxidizing Agent>

The oxidizing agent used in the polishing composition of the present invention oxidizes a metal or a metal alloy, and contributes to elevation of the removal rate. Examples of the aforementioned oxidizing agent include oxygen, ozone, hydrogen peroxide, alkyl peroxides (e.g. t-butyl hydroperoxide and ethylbenzene hydroperoxide), peracids (e.g. peracetic acid and perbenzoic acid), permanganate salts (e.g. potassium permanganate), periodate salt (e.g. potassium periodate), persulfate salts (e.g. ammonium persulfate and potassium persulfate), polyoxo acids, and hypochlorite salts (e.g. potassium hypochlorite). Among these oxidizing agents, hydrogen peroxide, persulfate salts and hypochlorites, which can be simply handled, are preferred. In particular, hydrogen peroxide is preferred.

The amount of the oxidizing agent is not particularly specified because a different appropriate range exists for each case depending on metals to be polished or a pH of the solution or the like. However, it is preferably to use in an amount of 0.01 to 30 mass %, more preferably 0.05 to 20 mass %, particularly preferably 0.1 to 10 mass % with respect to the polishing composition. When the amount is excessively small or large, it may be possibly difficult to attain a sufficient removal rate. A large amount may require economically disadvantageous treatment of waste of the polishing composition.

<Silica Abrasive>

As for the silica abrasive, any silica abrasive may be used but, in particular, colloidal silica is preferably used. The amount added of the silica abrasive is generally 30 mass % or less, preferably 20 mass % or less, more preferably 10 mass % or less, based on the polishing composition. If the amount added is excessively large, this gives rise to progress of dishing or increase of scratches. Also, in view of planarization, the amount added of the silica abrasive is preferably 0.1 mass % or more based on the polishing composition.

<pH>

The chemical-mechanical polishing composition of the present invention is adjusted to a pH of 8 to 12, which is a pH other than the vicinity of the isoelectric point of the silica abrasive, preferably to a pH of 8 to 10.5.

<Acid>

The polishing composition of the present invention may optionally contain sulfuric acid, lactic acid or an aliphatic dicarboxylic acid having 7 or more carbon atoms.

As for the aliphatic dicarboxylic acid, 3-methyladipic acid, pimelic acid, sebacic acid, tridecanedioic acid or mixtures of two or more thereof may preferably be used.

The content of the aliphatic dicarboxylic acid is preferably from 0.001 to 10 mass %, more preferably from 0.005 to 10 mass %, still more preferably from 0.01 to 5 mass %, based on the polishing composition. If the content of the aliphatic dicarboxylic acid is small, an appropriate increase in the removal rate for a metal film and an insulating film may not be obtained, whereas if the content is large, the removal rate for copper or a copper alloy may become excessively high or, depending on the case, the solution may not be stable.

The content of the sulfuric acid and/or lactic acid is, for example, preferably from 0.001 to 10 mass %, more preferably from 0.002 to 5 mass %, still more preferably from 0.005 to 2 mass %, based on the polishing composition. If the content of the sulfuric acid and/or lactic acid is excessively small, an appropriate removal rate may not be obtained, whereas if it is too large, the etching rate for a metal or a metal alloy may become excessively high.

Such an acid can be added so as to accelerate, as an etching agent, the polishing of a metal or a metal alloy, and also to perform stable polishing. One of these acids may be added or two or more thereof may be added as a mixture.

<Use of the Chemical-Mechanical Polishing Composition of the Present Invention>

The chemical-mechanical polishing composition of the present invention may be used at a temperature of 0 to 100° C. The polishing composition of the present invention is, in general, preferably used at about room temperature, However, the temperature of the polishing composition may be adjusted, e.g. to control a removal rate. When the temperature is too low, the removal rate cannot be increased, and the polishing liquid may be solidified at a temperature below 0° C. whereas, when the temperature is excessively high, there is a possibility that an undesired side reaction may occur. The temperature is preferably 10 to 50° C., and more preferably 15 to 40° C.

The amount of the polishing composition supplied to a polishing machine is determined in accordance with the sizes of the polishing machine and the wafer to be polished. When an 8-inch wafer is polished, an amount of 10 to 1,000 mL/min may be preferably employed. The amount is more preferably 50 to 500 mL/min, particularly preferably 100 to 400 mL/min. The amount of supplied composition may be changed in the course of polishing. For example, the amount of supplied composition may be increased or decreased half way through the polishing time.

The subject to be preferably polished by use of the polishing composition of the present invention includes a metal and an insulative film. The polishing composition of the present invention can preferably be used both for polishing all or a part of the subject to be polished. Examples of preferable metals to be polished include aluminum, copper, iron, tungsten, nickel, tantalum, platinum group metals (e.g. ruthenium and platinum), and alloys thereof. More preferably, the polishing composition of the present invention can be used for a metal film which forms and covers a wiring part of a multi-layer wiring part, and a barrier film which is formed between the wiring metal film and a substrate. Even more preferably, the polishing composition of the present invention can be used for a copper, copper alloy, iron, iron alloy, etc. which will form a wiring part of a multi-layer wiring part, and a tantalum, tantalum alloy, tantalum compound such as tantalum nitride, titanium, titanium alloy, etc. which is a barrier film.

An insulative film includes an insulative film which is generally used as an inter-layer dielectric film or a cap layer. A compound forming an insulative film includes an inorganic silicon compound containing large amount of silicon such as silicon oxide ($SiO_2$), SiN, SiNO, SiOC, SiCN, hydroxylsesquioxane (HSQ) or methylsilsesquioxane (MSQ); an organic compound such as benzocyclobutene; and mixtures thereof. An insulative film may be laminated layers of these compounds, or a low dielectric constant film comprising pores dispersed therein.

In the polishing method employing the polishing composition of the present invention, a substrate having a film to be polished is pressed against a polishing pad on a platen. While the polishing composition of the present invention is fed between the polishing pad and the substrate, relative movement between the platen and the substrate is effected, thereby polishing the film to be polished. In this case, a conventional polishing machine having a holder for holding a semiconductor substrate and a platen onto which a polishing pad is affixed may be employed.

The linear speed obtained by rotation of the platen varies considerably depending on the structure and size of the polishing machine employed and, therefore, it cannot be predetermined definitively. However, for example, it is possible to employ a linear speed of 10 to 500 m/min, preferably 20 to 300 m/min, more preferably 30 to 150 m/min. In order to perform uniform polishing of the substrate through rotation of the platen, the substrate must be rotated. The substrate is rotated at a speed almost equal to that of the platen and, in some cases, the rotation number of the substrate may be slightly increased or decreased so as to accomplish uniform polishing.

The substrate is pressed against the polishing pad by means of a holder. The pressure may be preferably 0.1 to 100 kPa. The pressure cannot be predetermined definitively, because when the rotation speed of the platen is high, the pressure is prone to decrease. However, the pressure is preferably 0.5 to 80 kPa, more preferably 1 to 50 kPa. These polishing conditions may be changed in the course of polishing. For example, the rotation speed may be increased or decreased half way through the polishing time.

The polishing pad employed in the present invention is generally made of unwoven fabric or polyurethane foam. Many polishing pads have grooves so as to accelerate polishing and to facilitate discharge of a polishing slurry. Examples of such grooved polishing pads include a polishing pad having grooves in the lengthwise and widthwise directions (XY groove) and a polishing pad having concentric grooves (K groove). The polishing composition of the present invention is applicable to any of these polishing pads. Polishing pads are generally dressed by means of a diamond dresser so as to prevent clogging and to perform reliable polishing. In the present invention, any conventionally known dressing method may be employed.

The polishing composition of the present invention may be continuously supplied onto the polishing pad on the platen by use of a pump or a similar apparatus. The polishing composition to be supplied may be in the form of a single liquid containing all ingredients. Alternatively, the composition may be supplied in a divided manner in the form of a plurality of liquid components in separate lines (e.g. oxidizing agent solution such as hydrogen peroxide solution and other solutions; a polishing solution composed mainly of abrasive and a solution comprising other components; or the like) in consideration of the stability of the polishing liquid.

In these cases, the divided solutions may be combined to form a single solution just before supplying to a polishing pad. In such a case, a plurality of lines may be connected to a single line, or a mixing device such as a reservoir for mixing a plurality of polishing solutions may be used. Alternatively, respective polishing solutions may be supplied through separate lines to a polishing pad. The flow rates of respective solutions may be changed in the course of polishing. For example, when a combination of two solutions are used, the flow rate of one of the two solutions is increased or decreased half way through the polishing time.

A substrate wherein the film to be polished is planarized can be produced by such a polishing method. This step is described by referring to a method of forming wiring on a device.

A trench and an opening for forming wiring are formed in an inter-layer dielectric film on a substrate, and a thin barrier film is formed on the inter-layer dielectric film. Furthermore, a metal film for metal wiring, such as copper, is formed by plating or the like to fill the trench and opening. This metal film is polished and the exposed barrier film and inter-layer dielectric film are then polished for planarization, thereby a substrate comprising a planarized metal film can be produced.

The polishing solution of the present invention can be applied to the chemical-mechanical polishing of a metal film and a barrier film for metal wiring and that of an inter-layer dielectric film. Preferably, in a two-stage polishing method comprising a first step of polishing copper or a copper alloy at a high speed, and a second step of polishing a barrier film, the polishing solution is effective for the polishing in the second step.

The wiring method employed in MRAMs will next be described. The metal wiring provided in an MRAM comprises a conductor layer composed of aluminum or aluminum alloy, or copper or copper alloy; and a ferromagnetic layer composed of nickel-iron (Permalloy), etc. and covering the conductor layer. A thin barrier film composed of a certain material (e.g. tantalum or tantalum nitride) is formed to sandwich the ferromagnetic layer. The metal wiring is formed through the damascene process, and excess portions of the conductor layer, the ferromagnetic layer, and the barrier film are removed through polishing performed to provide a planar surface.

The polishing composition of the present invention may be stored in the form of a plurality of separate compositions during transportation or storage, considering convenience of handling, such as stability of solutions. For example, the polishing composition may be divided into an oxidant solution and a remaining solution. The polishing composition may be divided into a solution mainly composed of the abrasive and a remaining solution. Also, the polishing composition may be prepared as a thicker composition condensed than when used, which is used after diluting with water, etc. to a concentration appropriate for polishing.

EXAMPLES

The present invention is described in greater detail below by referring to Examples 1 to 8 and Comparative Examples 1 to 6, but the present invention is not limited to these Examples in any way.

<Wafer>

The wafers used here are as follows.

Blanket Wafer with Tantalum Film

A silicon wafer uniformly lined with a tantalum film.

Blanket Wafer with Copper Film

A silicon wafer wherein the tantalum film of a blanket wafer with a tantalum film is uniformly lined with a copper film.

Blanket Wafer with Silicon Oxide Film:

A silicon wafer uniformly lined with a silicon oxide film formed by CVD.

Substrate Sample:

A silicon wafer 1 for the formation of a copper wiring pattern was provided, the silicon wafer having a trench 2 depth of 500 nm and the line 2'/space 3 of 100 μm/100 μm (or 9 μm/1 μm). A 25 nm-thick tantalum barrier film 4 was formed on the silicon wafer 1 for the formation of a copper wiring pattern, and a 1,000 nm-thick copper film 5 was formed on the entire surface thereof to obtain a pattern wafer shown in FIG. 1(a). This pattern wafer was polished by using a copper or copper alloy polishing solution having a sufficiently high removal rate for copper as compared with tantalum to give a dishing amount of 50 nm or less in the state of the barrier layer being exposed on the insulating film part. In this way, a substrate sample shown in FIG. 1(b) was prepared.

Incidentally, all samples were used by cutting the substrate into a size of 4×4 cm.

<Polishing Conditions>

The polishing conditions used for the polishing of the wafer are as follows.

Wafer dimension: 4×4 cm

Linear velocity: 70 m/min

Polishing pad: IC1400 produced by Rodel Nitta Company

Polishing composition feed rate: 13 ml/min

Polishing pressure: 15 kPa

<Evaluation of Polishing Characteristics>

The polishing characteristics were measured as follows.

Cu and Ta Removal Rates:

The thickness of each of the copper film and the tantalum film before and after polishing was determined from the sheet resistance value of the film, and the removal rate was calculated from the determined value and the polishing time.

Silicon Oxide Removal Rate:

The thickness of the silicon oxide film before and after polishing was determined by using an optical interference-type thickness meter, and the removal rate was calculated from the determined value and the polishing time.

Figure 2:
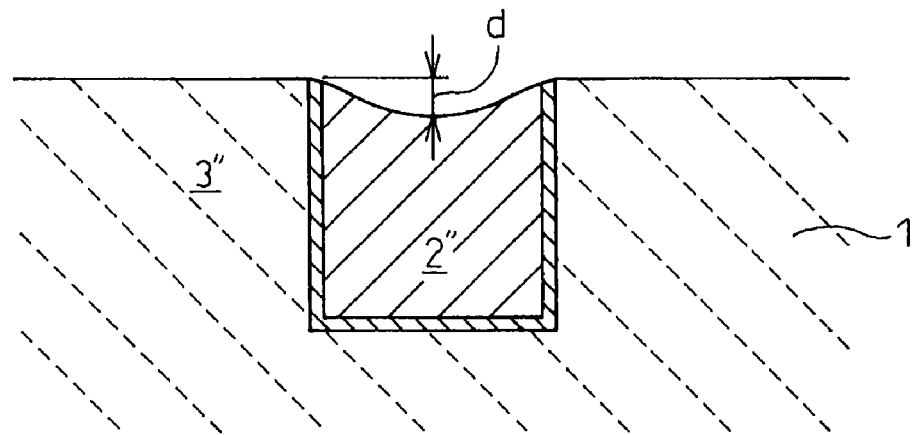
FIG. 2 is a transverse cross-sectional view showing dishing of a wafer.

Evaluation of Dishing:

The blanket wafer with a tantalum film was polished by using each polishing solution of Examples and Comparative Example, and after determining the tantalum removal rate, the polishing time necessary for polishing 25 nm-thick tantalum was calculated. The substrate sample in which the tantalum barrier film was exposed was polished by using each polishing solution of Examples and Comparative Examples for 30 seconds in addition to the time period calculated above. As shown in FIG. 2, the step "d" between the height of a 100-μm space part 3" and the height of a 100-μm line part 2" was defined as the dishing and evaluated. The step was measured by using a probe-type step meter.

Figure 3:
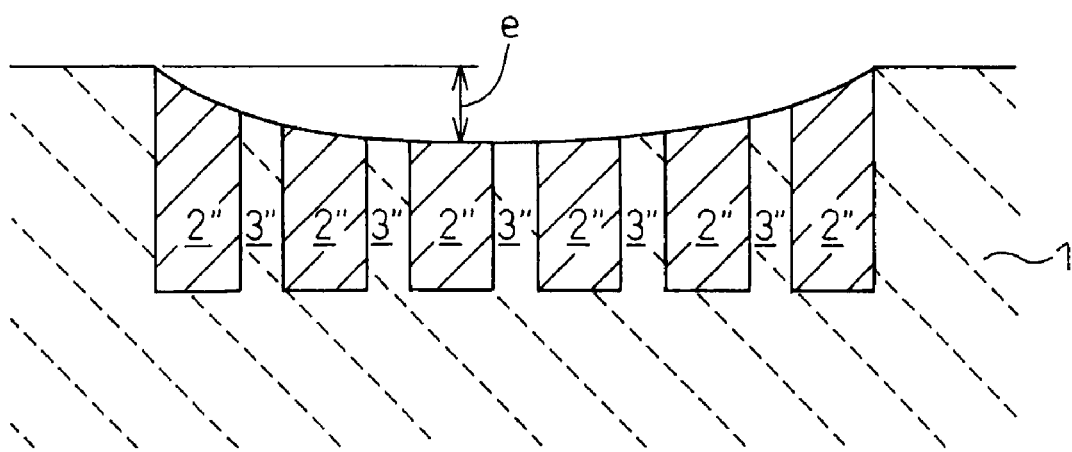
FIG. 3 is a transverse cross-sectional view showing erosion of a wafer.

Measurement of Erosion:

The blanked wafer with a tantalum film was polished by using each polishing solution of the Examples and the Comparative Example and, after determining the tantalum removal rate, the polishing time necessary for polishing 25 nm-thick tantalum was calculated. The substrate sample in which the tantalum barrier film was exposed was polished by using each polishing solution of Examples and Comparative Examples for 30 seconds in addition to the time period calculated above. As shown in FIG. 3, the loss "e" of the insulating film in the space part at a line/space of 9 μm/1 μm was measured as the erosion. The step was measured by using a probe-type step meter.

<Formulation of Polishing Composition>

The formulations of polishing compositions of Examples 1 to 8 and Comparative Examples 1 to 6 are shown in Tables 1-1 and 1-2.

TABLE 1-1

| | | | No. Example | | | | | | | |
|---|---|---|---|---|---|---|---|---|---|---|
| | | | 1 | 2 | 3 | 4 | 5 | 6 | 7 | 8 |
| Abrasive grain | colloidal silica A | (mass %) | 8 | 8 | 8 | 8 | 8 | 8 | 8 | 8 |
| | alumina | (mass %) | | | | | | | | |
| Oxidizing agent | hydrogen peroxide | (mass %) | 1 | 1 | 1 | 1 | 1 | 1 | 1 | 1 |
| Sulfonic acid | methanesulfonic acid | (mass %) | 1.3 | 0.8 | 0.1 | 0.1 | 0.1 | 0.1 | 0.1 | 0.1 |
| Dicarboxylic acid | 3-methyladipic acid | (mass %) | | | 1 | | | | | |
| | pimelic acid | (mass %) | | | | 1 | | | 1 | 1 |
| | sebacic acid | (mass %) | | | | | 1 | | | |
| | tridecanedioic acid | (mass %) | | | | | | 1 | | |
| Tricarboxylic acid | citric acid | (mass %) | | | | | | | | |
| Inorganic acid | sulfuric acid | (mass %) | | | | | | | 0.005 | |
| Organic acid | lactic acid | (mass %) | | | | | | | | 0.02 |
| Base | KOH | (mass %) | 1.1 | 0.7 | 0.9 | 0.9 | 0.8 | 0.7 | 1 | 1 |
| | $NH_3$ | (mass %) | | | | | | | | |
| pH | | | 9.3 | 9.0 | 9.3 | 9.3 | 9.2 | 9.3 | 9.8 | 9.3 |

TABLE 1-2

| | | | No. Comparative Example | | | | | |
|---|---|---|---|---|---|---|---|---|
| | | | 1 | 2 | 3 | 4 | 5 | 6 |
| Abrasive grain | colloidal silica A | (mass %) | 5 | 8 | 8 | | | 5 |
| | alumina | (mass %) | | | | 10 | 4 | |
| Oxidizing agent | hydrogen peroxide | (mass %) | 0.3 | 1 | | | 1 | |
| Sulfonic acid | methanesulfonic acid | (mass %) | 0.05 | | 0.8 | 1 | 0.8 | |
| Dicarboxylic acid | 3-methyladipic acid | (mass %) | | | | | | |
| | pimelic acid | (mass %) | | | | | | |
| | sebacic acid | (mass %) | | | | | | |
| | tridecanedioic acid | (mass %) | | | | | | |
| Tricarboxylic acid | citric acid | (mass %) | | 1 | | | | |
| Inorganic acid | sulfuric acid | (mass %) | | | | | | |
| Organic acid | lactic acid | (mass %) | | | | | | |
| Base | KOH | (mass %) | | 1 | 0.7 | | 0.6 | |
| | $NH_3$ | (mass %) | | | | | | 0.03 |
| pH | | | 2.6 | 9.2 | 9.2 | 1.3 | 9.3 | 9.5 |

Each polishing composition according to the formulation shown in Tables 1-1 and 1-2 was prepared. Incidentally, colloidal silica A used in Examples 1 to 8 and Comparative Examples 1 to 3, 6 as an abrasive had a primary particle diameter of 30 to 40 nm and a secondary particle diameter of 70 nm. Alumina used in Comparative Examples 4 and 5 as an abrasive is a vapor phase process alumina having a specific surface area of 200 m²/g and a secondary particle diameter of 120 nm. The balance of the formulation shown in Tables 1-1 and 1-2 was water.

<Evaluation Results>

The results are shown in Tables 2-1 and 2-2.

TABLE 2-1

| | No. Example | | | | | | | |
|---|---|---|---|---|---|---|---|---|
| | 1 | 2 | 3 | 4 | 5 | 6 | 7 | 8 |
| Cu Removal rate (nm/min) | 23 | 20 | 50 | 46 | 38 | 36 | 35 | 36 |
| Ta Removal rate (nm/min) | 90 | 81 | 83 | 79 | 84 | 73 | 68 | 91 |
| Silicon oxide film removal rate (nm/min) | 64 | 50 | 53 | 59 | 52 | 48 | 49 | 60 |
| Dishing (nm) | 6 | 6 | 15 | 14 | 3 | 6 | 7 | 14 |
| Erosion (nm) | 4 | 2 | 2 | 2 | 8 | 9 | 4 | 2 |

TABLE 2-2

| | No. Comparative Example | | | | | |
|---|---|---|---|---|---|---|
| | 1 | 2 | 3 | 4 | 5*[2] | 6 |
| Cu Removal rate (nm/min) | 171 | 99 | 41 | 23 | 15 | 51 |
| Ta Removal rate (nm/min) | 52 | 68 | —*[1] | 6 | 9 | 4 |
| Silicon oxide film removal rate (nm/min) | 95 | 41 | 45 | 5 | 2 | 3 |
| Dishing (nm) | 264 | 85 | —*[1] | 117 | 7 | 174 |
| Erosion (nm) | 213 | 58 | —*[1] | 25 | 6 | 143 |

*[1] Incapable of measurement because of unevenness
*[2] A large number of scratches are observed As can be seen from comparison with the chemical-mechanical polishing composition of Comparative Examples 1 to 6, the chemical-mechanical polishing composition of Examples 1 to 8 of the present invention can achieve high-speed polishing while suppressing dishing and erosion and, in particular, can maintain the flatness of the metal film.

That is, when the polishing composition comprises methanesulfonic acid and an oxidizing agent having an acidic pH (Comparative Example 1) and when the polishing composition comprises citric acid in place of methanesulfonic acid (Comparative Example 2), dishing and erosion can not be controlled. When the polishing composition comprises methanesulfonic acid does not comprise an oxidizing agent (Comparative Example 3), the Ta removal rate is small and Ta is unevenly polished and therefore, a substrate surface can not be evenly polished. When the polishing composition comprises an alumina as an abrasive (Comparative Examples 4 and 5), the Ta and the silicon oxide removal rates are small in comparison with the Cu removal rate. Particularly, when the polishing composition has an acidic pH (Comparative Example 4), dishing becomes very large and, when the polishing composition has a basic pH (Comparative Example 5), the abrasive particle aggregates to leave a large number of scratches on a substrate polished. The scratches can be visually observed. When the polishing composition merely comprises ammonia to have a basic pH but does not comprises methanesulfonic acid and an oxidizing agent (Comparative Example 6), the Ta and silicon oxide removal rates are small in comparison with the Cu removal rate and, therefore, the polishing of a Ta film requires a long time which produces a dishing.

On the other hand, the chemical-mechanical polishing compositions of Examples 1 to 8 improve the removal rates for Cu, Ta and silicon oxide films, and inhibit dishing and erosion, and do not leave substantial scratches after polishing, the polishing composition comprising methanesulfonic acid, an alkaline metal, an oxidizing agent and a silica abrasive, and having a pH of 8 to 12.

Also, among Examples 1 to 8, it can be seen that, in Examples 3 to 8 where the polishing composition contains sulfuric acid, lactic acid, an aliphatic dicarboxylic acid having 7 or more carbon atoms, or mixtures thereof, a high copper removal rate can be obtained with dishing and erosion suppressed.

The invention claimed is:

1. A chemical-mechanical polishing composition comprising methanesulfonic acid, an alkali metal ion, an oxidizing agent, a silica abrasive and water, and having a pH of 8 to 12.

2. The chemical-mechanical polishing composition according to claim 1, wherein the alkali metal ion is potassium ion.

3. The chemical-mechanical polishing composition according to claim 1, wherein the oxidizing agent is hydrogen peroxide.

4. The chemical-mechanical polishing composition according to claim 1, wherein the pH is from 8 to 10.5.

5. The chemical-mechanical polishing composition according to claim 1, wherein the content of the methanesulfonic acid is from 0.005 to 10 mass % based on the chemical-mechanical polishing composition.

6. The chemical-mechanical polishing composition according to claim 1, wherein the content of the oxidizing agent is from 0.01 to 30 mass % based on the chemical-mechanical polishing composition.

7. The chemical-mechanical polishing composition according to claim 1, wherein the content of the silica abrasive is 30 mass % or less based on the chemical-mechanical polishing composition.

8. The chemical-mechanical polishing composition according to claim 1, wherein the chemical-mechanical polishing composition comprises an additional acid selected from the group consisting of sulfuric acid, lactic acid, an aliphatic dicarboxylic acid having 7 or more carbon atoms, and mixtures thereof.

9. The chemical-mechanical polishing composition according to claim 8, wherein the aliphatic dicarboxylic acid is selected from the group consisting of 3-methyladipic acid, pimelic acid, sebacic acid and tridecanedioic acid.

10. The chemical-mechanical polishing composition according to claim 8, wherein the content of the additional acid is from 0.001 to 10 mass % based on the chemical-mechanical polishing composition.

11. A composition which provides the chemical-mechanical polishing composition according to claim 10 when the composition is diluted with water.

12. A method for transporting or storing a chemical-mechanical polishing composition, wherein the method comprises using the composition according to claim 11.

13. A method for producing a substrate, wherein the method comprises planarizing a substrate by using the chemical-mechanical polishing composition according to claim 1, the substrate comprising an insulating film having a trench, a barrier film formed on the insulating film, and a wiring material film buried in the trench and covering the barrier film.

14. The method for producing a substrate according to claim 13, wherein the wiring material film is a film of copper or a copper alloy.

15. The method for producing a substrate according to claim 13, wherein the insulating film is a film of a material selected from the group consisting of an inorganic silicon compound and an organic compound.

16. The method for producing a substrate according to claim 15, wherein the inorganic silicon compound is a material selected from the group consisting of $SiO_2$, SiN, SiNO, SiOC, SiCN and mixtures thereof.

17. The method for producing a substrate according to claim 13, wherein the barrier film is a film of a material selected from the group consisting of tantalum, a tantalum alloy, a tantalum compound and mixtures thereof.

18. A kit comprising a plurality of compositions, wherein the plurality of compositions provides the chemical-mechanical polishing composition according to claim 1 when plurality of compositions are mixed together or when plurality of compositions are mixed together and diluted with water.

19. A method for transporting or storing a chemical-mechanical polishing composition, wherein the method comprises using the kit according to claim 18.

* * * * *